United States Patent [19]
Yoshida

[11] Patent Number: 5,128,968
[45] Date of Patent: Jul. 7, 1992

[54] APPARATUS FOR CANCELLING CARRIER PHASE JITTERS

[75] Inventor: Atsushi Yoshida, Tokyo, Japan

[73] Assignee: NEC Corporation, Tokyo, Japan

[21] Appl. No.: 385,469

[22] Filed: Jul. 27, 1989

[30] Foreign Application Priority Data

Jul. 27, 1988 [JP] Japan .................. 63-185415

[51] Int. Cl.$^5$ .......................................... H04L 27/06
[52] U.S. Cl. ...................... 375/97; 375/118; 328/155; 328/162
[58] Field of Search .............. 375/11, 12, 14, 98, 375/99, 103, 97, 118, 119, 120; 328/155, 162, 164; 455/258, 260, 265

[56] References Cited

U.S. PATENT DOCUMENTS

| | | | |
|---|---|---|---|
| 4,320,526 | 3/1982 | Gitlin | 375/14 |
| 4,412,299 | 10/1983 | Huffman | 375/118 |
| 4,447,910 | 5/1984 | Smith et al. | 375/99 |
| 4,495,468 | 1/1985 | Richards et al. | 328/155 |
| 4,514,855 | 4/1985 | Lang et al. | 328/155 |
| 4,631,738 | 12/1986 | Betts et al. | 375/98 |
| 4,683,578 | 7/1987 | Betts et al. | 375/118 |
| 4,689,804 | 8/1987 | Srinivasagopalan et al. | 375/99 |
| 4,792,964 | 12/1988 | Yoshida | 375/12 |
| 4,856,031 | 8/1989 | Yoshida | 375/118 |

Primary Examiner—Stephen Chin
Attorney, Agent, or Firm—Foley & Lardner

[57] ABSTRACT

A jitter cancelling apparatus cancels both low and high frequency jitter in a carrier signal. The jitter cancelling apparatus has both a phase-locked-loop for cancelling lower frequency jitter and a predictive jitter canceller for cancelling higher frequency jitter. The jitter cancelling apparatus also has a control circuit which contains a jitter frequency measuring circuit for measuring jitter frequency. The control circuit determines whether the jitter cancelling circuit or the phase locked-loop is effectively operative according to whether the jitter frequency is above or below a predetermined value.

10 Claims, 2 Drawing Sheets

APPARATUS FOR CANCELLING CARRIER PHASE JITTERS

BACKGROUND OF THE INVENTION

The present invention relates to a data transmission system for transmitting data over telephone lines or similar analog lines and, more particularly, to a jitter cancelling apparatus for carrier phase control associated with a receiver of such a data transmission system.

In a data transmission system, signals usually undergo various kinds of deterioration as typified by amplitude distortions, delay distortions, carrier frequency offsets and carrier phase jitters while being transmitted over lines. Among them, amplitude distortions and delay distortions are almost time-invariant or, if time-variant, the variation is slow enough to allow such distortions to be compensated for by so-called automatic equalizers. Carrier phase jitters, on the other hand, result in time-variant distortions and this kind of distortion has hitherto been absorbed by a phase locked loop (PLL).

The PLL scheme, however, cannot sufficiently suppress phase jitters (especially, high-frequency jitters) unless the frequency band of the PLL is broadened to the order of 200 hertz to 300 hertz. Such a broad loop band would deteriorate the noise characteristic of the PLL and thereby lower the resistivity to noise of the entire data transmission system.

Another implementation for the suppression of phase jitters heretofore proposed is a jitter canceller system as disclosed in U.S. Pat. No. 4,639,939. The jitter canceller system uses a predictive filter, which is tuned to phase jitters, so as to cancel phase jitters being superimposed on a carrier wave. This type of system can be implemented with a narrow-band PLL which is adapted to recover a carrier wave, thereby eliminating the deterioration of the resistivity to noise. However, a problem with the jitter canceller system is that the predictive filter has to be scaled up in inverse proportion to the lower limit of phase jitter frequency which is to be suppressed. Should the system be designed to cope with even the jitter whose frequency is as low as 20 hertz or so, the hardware scale would become excessively large and therefore impractical.

SUMMARY OF THE INVENTION

It is therefore an object of the present invention to provide an apparatus capable of cancelling phase jitters over a wide frequency range while reducing the hardware scale of the apparatus.

A jitter cancelling apparatus of the present invention has a phase locked loop for suppressing phase jitters whose frequency is lower than 50 hertz, a jitter canceller for suppressing phase jitters the frequency of which is higher than 50 hertz, and a control circuit for controlling the PLL and jitter canceller. The control circuit has a jitter frequency measuring circuit and, when the measured jitter frequency is lower than 50 herts, renders the jitter canceller inoperative. When the measured jitter frequency is higher than 50 hertz, the control circuit sets up a PLL frequency band of 1 hertz so as to allow the jitters to be mainly cancelled by the jitter canceller.

BRIEF DESCRIPTION OF THE DRAWINGS

The above and other objects, features and advantages of the present invention will become more apparent from the following detailed description taken with the accompanying drawings in which:

FIG. 3 is a block diagram showing the loop filter in detail.

FIG. 4 is a block diagram showing the zero-cross counter in detail.

Figure 1:
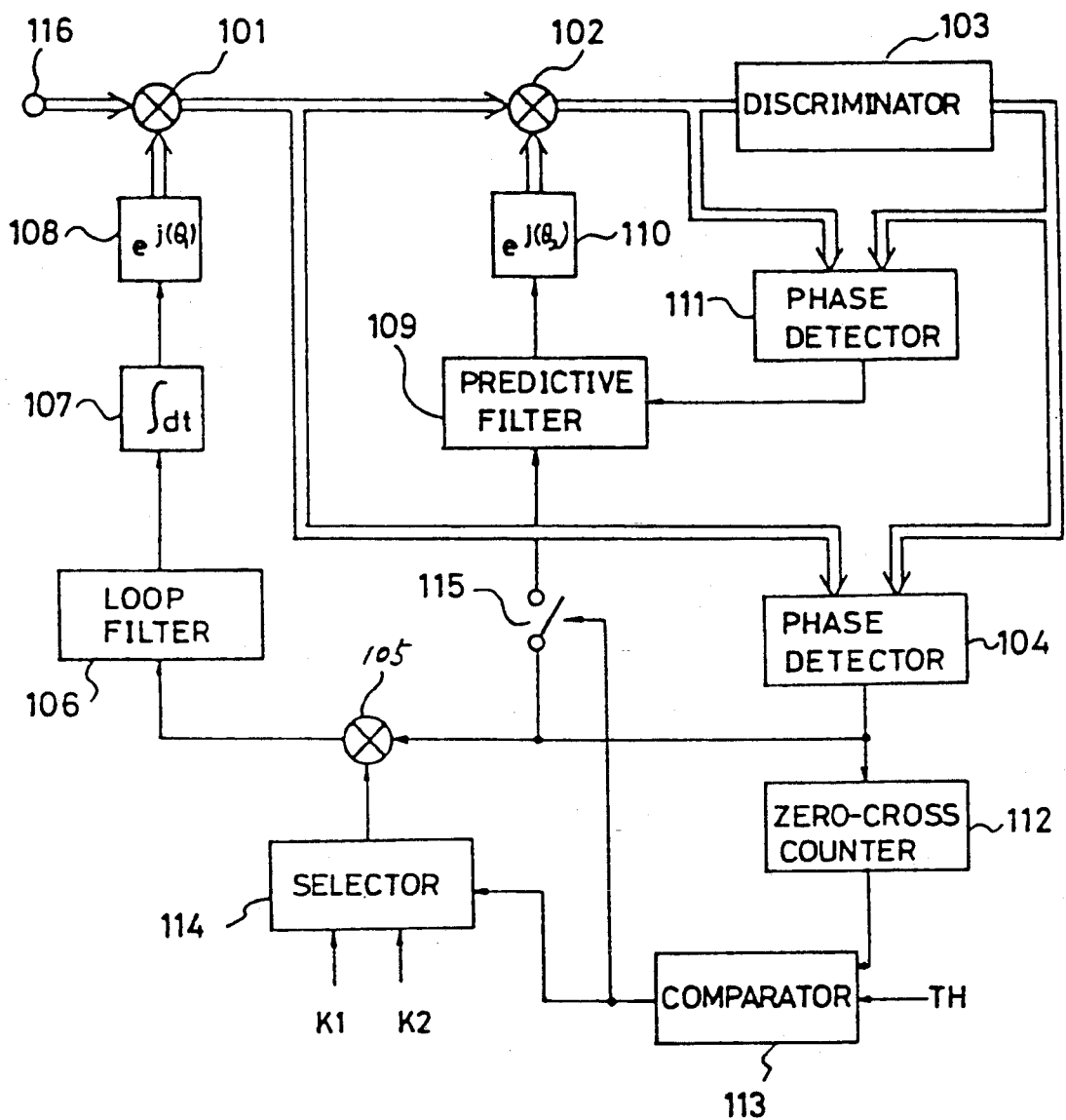
FIG. 1 is a block diagram showing an embodiment of the present invention.

In the drawings, thick lines represent complex signals and thin lines, real signals or control signals.

DESCRIPTION OF THE PREFERRED EMBODIMENT

Referring to FIG. 1 of the drawings, a jitter cancelling apparatus embodying the present invention is shown in a schematic block diagram. As shown, the apparatus has an input terminal 116 to which a complex baseband signal is applied, and a first phase rotator 101 which rotates the baseband signal by a first phase to produce a first phase-rotated signal. A second phase rotator 102 rotates the first phase-rotated signal by a second phase to output a second phase-rotated signal. A discriminator 103 discriminates the second phase-rotated signal to produce a discriminated signal. A phase detector 104 detects the phase of the first phase-rotated signal on the basis of the output of the discriminator 103, i.e., the discriminated received signal and the first phase-rotated signal which is fed thereto from the phase rotator 101. The first phase-rotated signal outputted by the phase detector 104 is multiplied by a constant $K_1$ or $K_2$ ($K_1 > K_2$) using a multiplier 105, and the resulting signal is smoothed by a loop filter 106. The smoothed output of the loop filter 106 is integrated by an integrator 107. In response to the integrated phase, a trigonometric function generator 108 (simply labeled as "$e^{j\theta_1}$") generates a first phase $\theta_1$. This first phase is applied to the phase rotator 101, as stated earlier, so that the received signal is rotated on the basis of the first phase. The elements 101 and 103 to 108 stated above form a common PLL in combination. The constants $K_1$ and $K_2$ are selected one at a time by a selector 114 and used to set up a loop gain of such a PLL. In the illustrative embodiment, the loop gains $K_1$ and $K_2$ are selected to provide a loop frequency band of about 50 hertz and a loop frequency band of about 1 hertz, respectively.

The detected phase from the phase detector 104 is also routed to a predictive filter 109 via a switch 115. In response, the predictive filter 109 predicts a phase jitter. A trigonometric function generator 110 (simply labeled as "$e^{j\theta_2}$") generates a second phase $\theta_2$ in response to the predicted phase jitter and delivers it to the phase rotator 102. The phase rotator 102, therefore, rotates the first phase-rotated signal as previously stated, in response to the second phase. A phase detector 111 detects the phase of the second phase-rotated signal on the basis of the second phase-rotated signal and the discriminated signal, the detected phase being fed to the predictive filter 109 in the form of a control signal for coefficient adjustment. The coefficient adjustment of the prediction filter 109 per se is shown and described in the previously mentioned U.S. Pat. No. 4,639,939 in detail, and redundant description will be omitted for simplicity.

In the illustrative embodiment, the predictive filter 109 has a number of taps N which is selected such that the minimum prediction frequency is about 50 hertz.

A zero-cross counter 112 counts the number of times that the phase signal from the phase detector 104 crosses the zero level within a predetermined period of time. Hence, the output of the zero-cross counter 112 is proportional to the frequency of the detected phase signal, i.e., the frequency of a phase jitter. A comparator 113 determines whether the output of the zero-cross counter 112 is greater or smaller than a threshold value TH which is representative of the frequency of 50 hertz.

When the frequency of a phase jitter is higher than 50 hertz as determined by the comparator 113, the selector 114 selects $K_2$ as a loop coefficient and, at the same time, closes the switch 115. In this condition, a loop frequency band of about 1 hertz is set up and the predictive filter 109 is activated, whereby the phase jitter is mainly suppressed by the phase rotator 102. Conversely, when the frequency of a phase jitter is lower than 50 hertz, the selector 114 selects $K_1$ as a loop coefficient and opens the switch 115. Then, a loop band of about 50 hertz is set up and the predictive filter 109 is deactivated, so that the phase jitter is suppressed by the phase rotator 101.

Figure 2:
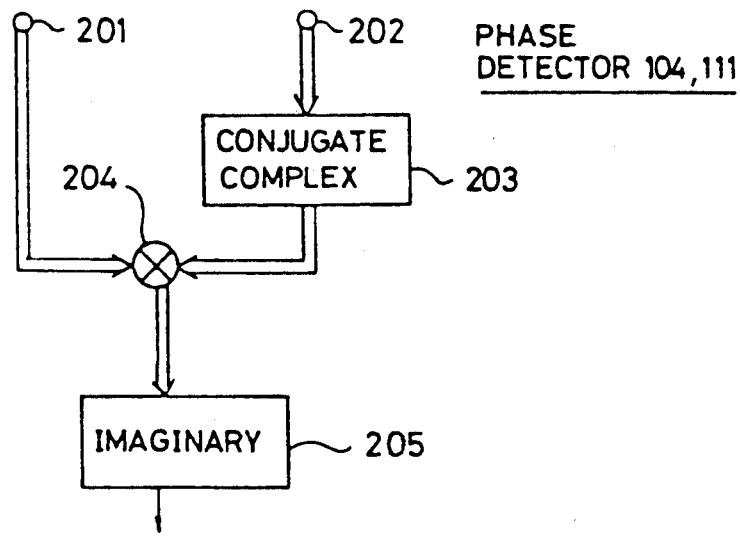
FIG. 2 to 4 is a block diagrams showing the phase detector in detail.

Referring to FIG. 2, a specific construction of the phase detector 104 or 111 is shown. As shown, the phase detector 104 (111) has a terminal 201 for receiving the first (second) phase-rotated signal from the phase rotator 101 (102), a terminal 202 for receiving the discriminated signal from the discriminator 103, a complex conjugate unit 203 for producing a complex conjugate signal of the discriminated received signal, a multiplier 204 for producing a product of the first phase-rotated signal and the complex conjugate signal and an imaginary part selector 205 for separating an imaginary part of the product.

Assuming that a signal appearing on the terminal 201 is $$x = \gamma e^{j\theta} \quad \text{Eq. (1)}$$

and that a signal appearing on the terminal 202 is $$\hat{x} = \hat{\gamma} e^{j\hat{\theta}} \quad \text{Eq. (2)}$$

then the complex conjugate unit 203 modifies the Eq. (2) as $$\hat{x}^* = \hat{\gamma} e^{-j\hat{\theta}} \quad \text{Eq. (3)}$$

After the multiplier 204 has multiplied the signals represented by the Eqs. (1) and (3), the imaginary part selector 205 separates only an imaginary part y of the product. The imaginary part y is expressed as:

$$\begin{aligned} y &= Im[\gamma e^{j\theta} \cdot \hat{\gamma} e^{-j\hat{\theta}}] \\ &= Im[\gamma\hat{\gamma} e^{j(\theta-\hat{\theta})}] \\ &= \gamma\hat{\gamma} \sin(\theta - \hat{\theta}) \\ &\approx C(\theta - \hat{\theta}) \end{aligned} \quad \text{Eq. (4)}$$

assuming that $C \triangleq \gamma\hat{\gamma}$ and $\theta-\hat{\theta} \ll 1$.

Figure 3:
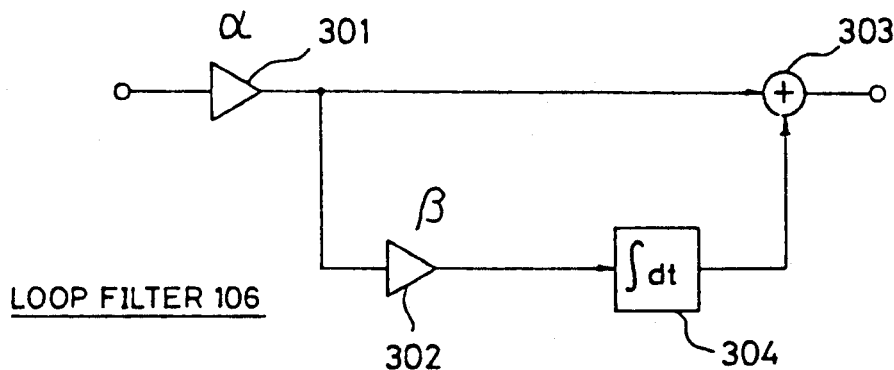

FIG. 3 indicates a specific construction of the loop filter 106. In the figure, the loop filter 106 is implemented as an ordinary full integration type loop filter and has coefficient units 301 and 302, an integrator 304, and an adder 303. The transfer function of the loop filter 106 is expressed as $$H(j\omega) = \alpha\left(1 + \frac{\beta}{j\omega}\right) \quad \text{Eq. (5)}$$

Figure 4:
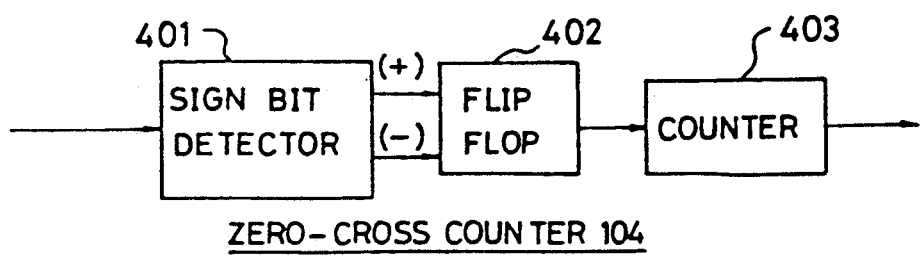

FIG. 4 is a schematic block diagram showing a specific construction of the zero-cross counter 112. In the figure, the zero-cross counter 112 observes the signs of successive sampled values so as to count the transitions of sign. Specifically, the zero-cross counter 112 is made up of a sign bit detector 401 for detecting the sign of a signal, a flip-flop 402 to be set and reset on the basis of the detected sign, and a counter 403 for counting outputs of the flip-flop 402.

Various modifications will become possible for those skilled in the art after receiving the teachings of the present disclosure without departing from the scope thereof.

What is claimed is:

1. A jitter cancelling apparatus comprising:
a carrier phase locked loop comprising:
first phase rotating means for producing a first phase-rotated signal by applying a first phase rotation to a received signal by a first phase control signal;
first phase detecting means for detecting a phase of the first phase-rotated signal to thereby produce a first detected phase signal; and
control means having a time constant for feeding to said first phase rotating means a signal which reduces the first detected phase signal, in the form of the first phase control signal;
a predictive jitter canceller comprising:
second phase rotating means for producing a second phase-rotated signal by applying a second phase rotation to the first phase-rotated signal by a second control signal;
second phase detecting means for detecting a phase of the second phase-rotated signal to thereby produce a second detected phase signal; and
predicting means responsive to the first and second detected phase signals for feeding a predicted signal to said second phase rotating means in the form of the second control signal;
phase jitter measuring means responsive to the first detected phase signal for producing a phase jitter frequency signal by measuring a frequency of a phase jitter of the received signal;
comparing means for producing a first comparison result signal when said phase jitter frequency signal is greater than a predetermined value and producing a second comparison result signal when said phase jitter frequency signal is smaller than said predetermined value; and
predicting means control means for activating said predicting means in response to the first comparison result signal and deactivating said predicting means in response to the second comparison result signal.

2. A jitter cancelling apparatus comprising:
carrier phase locked loop means for suppressing a first phase jitter included in a received signal to thereby produce a first jitter-suppressed signal;
predictive jitter canceller means for predicting a phase jitter for the basis of the first jitter-suppressed signal and, removing a second phase jitter from said first jitter-suppressed signal;

phase detecting means for producing a detected phase signal by detecting a phase of the first jitter-suppressed signal;

phase jitter measuring means for producing a phase jitter frequency signal by measuring a frequency of said phase jitter in response to the detected phase signal; and control means for rendering said predictive jitter canceller inoperative in response to said phase jitter frequency signal.

3. A jitter cancelling apparatus comprising:

jitter frequency measuring means for measuring jitter frequency and outputting a jitter frequency signal;

phase-locked-loop means responsive to said jitter frequency signal for phase-locking a carrier signal whenever said jitter frequency is less than a predetermined value; and predictive jitter cancelling means responsive to said jitter frequency signal for predictively cancelling said jitter whenever said jitter frequency is greater than said predetermined value.

4. A jitter cancelling apparatus as claimed in 3 wherein said predictive jitter cancelling means is operative whenever said jitter frequency is greater than said predetermined value.

5. A jitter cancelling apparatus as claimed in 3 wherein said phase-locked-loop means has a variable phase-locking bandwidth responsive to said jitter frequency signal, whenever said jitter frequency is less than said predetermined value, said variable phase-locking bandwidth has a first phase-locking bandwidth, and whenever said variable phase-locking bandwidth is greater than said predetermined value said variable phase-locking bandwidth has a second phase-locking bandwidth.

6. A jitter cancelling apparatus as claimed in 5 wherein said first phase-locking bandwidth is greater than said second phase-locking bandwidth.

7. A jitter cancelling apparatus as claimed in 5 wherein said first phase-locking bandwidth is larger than said second phase-locking bandwidth.

8. A jitter cancelling apparatus as claimed in 5 wherein said first phase-locking bandwidth is no greater than 1 Hz.

9. A jitter cancelling apparatus as claimed in 3 wherein said predictive jitter cancelling means is operative whenever, said jitter frequency is greater than said predetermined value, and said predictive jitter cancelling means is inoperative whenever said jitter frequency is less than said predetermined value.

10. A method of cancelling jitter in a signal comprising the steps of:

measuring the frequency of said jitter yielding a jitter frequency;

phase-locking said signal in a phase-locked-loop, whenever said jitter frequency is less than a predetermined value;

cancelling said jitter whenever said jitter frequency is greater than said predetermined value.

* * * * *